United States Patent [19]

Matsuura

[11] Patent Number: 4,595,821
[45] Date of Patent: Jun. 17, 1986

[54] SEMICONDUCTOR DEVICE FOR USE WITH A THERMAL PRINT HEAD

[75] Inventor: Yoshiaki Matsuura, Tokyo, Japan

[73] Assignee: Seikosha Instruments & Electronics Ltd., Tokyo, Japan

[21] Appl. No.: 535,859

[22] Filed: Sep. 26, 1983

[30] Foreign Application Priority Data

Sep. 27, 1982 [JP] Japan ............................ 57-168135

[51] Int. Cl.4 ............................................. B41J 3/20
[52] U.S. Cl. ................................ 219/216; 346/76 PH
[58] Field of Search ............ 219/216 PH; 346/76 PH, 346/76 R; 400/120; 307/270

[56] References Cited

U.S. PATENT DOCUMENTS

| 3,506,851 | 4/1970 | Polkinghorn | 307/270 |
| 3,582,909 | 6/1971 | Booher | 307/270 |
| 3,601,629 | 8/1971 | Cricchi | 307/270 |
| 3,673,438 | 6/1972 | Lund | 307/270 |
| 3,818,245 | 6/1974 | Suzuki | 307/270 |
| 3,874,493 | 4/1975 | Boyd | 346/76 PH |
| 3,912,947 | 10/1975 | Buchanan | 307/270 |
| 3,922,668 | 11/1975 | Kishimoto | 307/270 |
| 3,925,690 | 12/1975 | Spence | 307/270 |
| 3,936,676 | 2/1976 | Fujita | 307/270 |
| 3,944,848 | 3/1976 | Heeren | 307/270 |
| 3,946,369 | 3/1976 | Pashley | 307/270 |
| 4,049,978 | 9/1977 | Dru | 219/405 |
| 4,176,272 | 11/1979 | Powers | 219/216 PH |

Primary Examiner—C. L. Albritton
Assistant Examiner—Teresa J. Walberg
Attorney, Agent, or Firm—Robert E. Burns; Emmanuel J. Lobato; Bruce L. Adams

[57] ABSTRACT

Metal-oxide semiconductors are used for the logic control circuit and the drive circuit of a thermal print head to eliminate defects such as breakdowns and erroneous operations caused by heat generated in the thermal head and to reduce current consumption.

4 Claims, 6 Drawing Figures

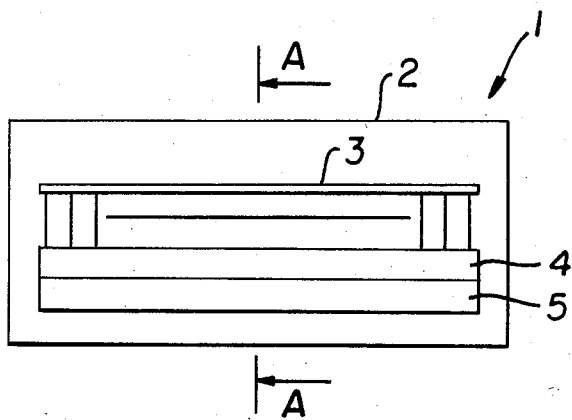
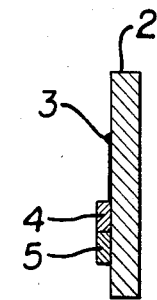
FIG. 1a    FIG. 1b
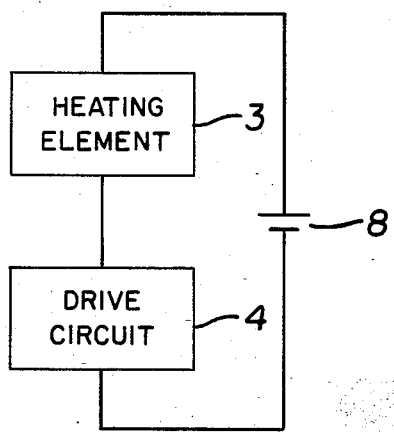
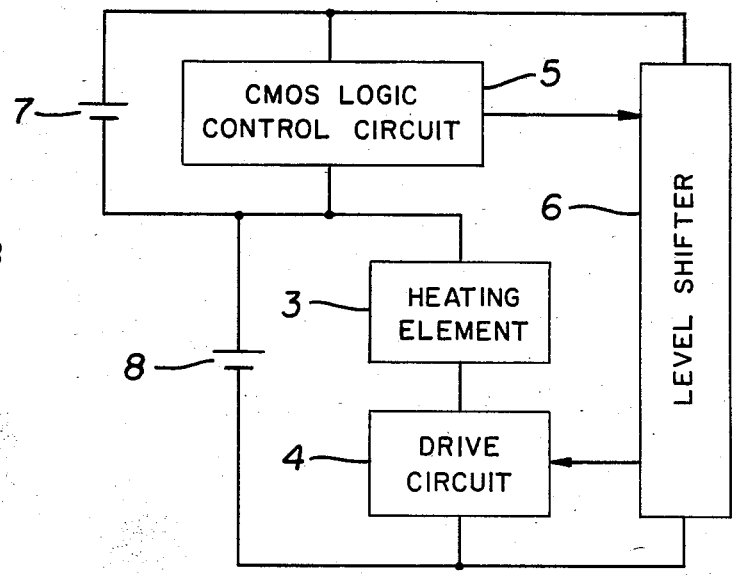
FIG. 2    FIG. 4
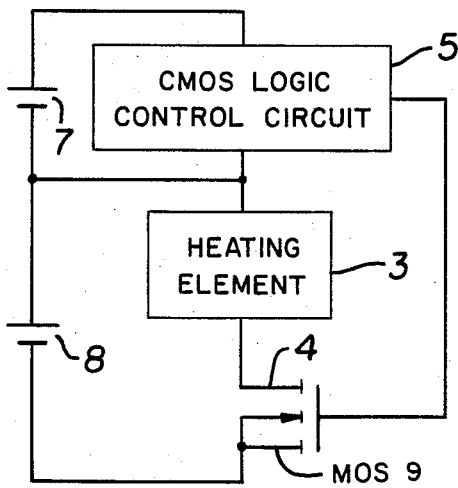
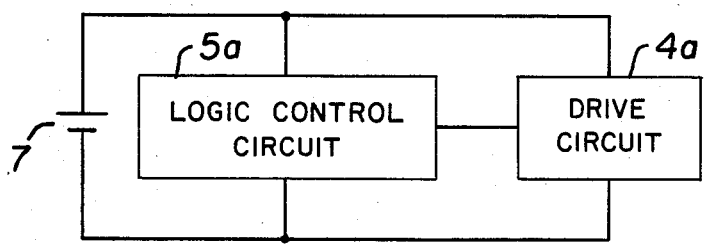
FIG. 5    FIG. 3 PRIOR ART

SEMICONDUCTOR DEVICE FOR USE WITH A THERMAL PRINT HEAD

BACKGROUND OF THE INVENTION

The present invention relates to a semiconductor device in which a drive circuit for driving a thermal print head and a logic control circuit for controlling the thermal head are each constituted by a P-channel MOS, an N-channel MOS, or a complementary MOS, or by a plurality of such devices.

A thermal print head 1 consists, as shown in FIGS. 1a and 1b, of a heating resistor 3, a drive circuit 4, and a logic control circuit 5 mounted on a ceramic substrate 2.

Since the heating resistor consumes a large current, a bipolar element has heretofore been used in the drive circuit 4 for driving the thermal print head, as shown in FIG. 3. As the temperature rises, the leakage current and the amplification factor of the bipolar element increase, so that the current driving the thermal head increases. Heat is generated by the increase in current, and hence a larger current flows. This phenomenon is usually known as thermal runaway. The heat generator in the thermal head generates heat. Therefore, when a bipolar element is mounted on the same substrate, conditions worsen and, if the substrate of the thermal head has a poor heat radiating efficiency, the bipolar element undergoes thermal breakdown. Thermal runaway and erroneous operations caused by heat present serious problems concerning the reliability of the thermal head.

Thermal print heads can be divided into the linear type and the serial type. In recent years, thermal heads of the linear type have been put into practice, and attention has been given to the generation of heat and consumption of large currents by bipolar elements. In the linear type of thermal head, 3 to 16 heat generator dots are provided per millimeter, and drivers are provided for each of them. For A-4 size, 1700 dots are required if 8 dots are provided per millimeter in the standard manner. Each dot must be supplied with a current of 20 mA to 80 mA to generate heat, which requires a power source with a large capacity. It therefore becomes necessary to reduce the current flowing into the logic circuit to as small as possible to minimize the load on the power source.

FIG. 3 shows the conventional setup of a thermal head employing a bipolar element. A bipolar logic control circuit 5a and a drive circuit 4a are supplied with a voltage of 4 to 6 volts from a power source 7, and a heat generator (not shown) is supplied with a high voltage of 15 to 30 volts. The logic control circuit 5a produces and output control signal for controlling the operation of the drive circuit 4a.

SUMMARY OF THE INVENTION

It is an object of the present invention to use metal-oxide semiconductors for the logic control circuit and drive circuit of the thermal head to eliminate the defects such as breakdowns and erroneous operations caused by heat generated in the thermal print head, as well as to reduce the current consumption so that the power source can be constructed at a reduced cost.

BRIEF DESCRIPTION OF THE DRAWINGS

FIGS. 1a and 1b are diagrams of the construction of the thermal print head used in the present invention;

FIG. 2 is a diagram of the fundamental setup of a thermal head driver and a heating unit employed in the present invention;

FIG. 3 is a diagram of the conventional setup of a thermal head driver consisting of a bipolar element and a logic control circuit;

FIG. 4 is a diagram of the semiconductor device according to the present invention; and FIG. 5 is a diagram of the fundamental setup of an MOS driver and a heating unit according to the present invention.

DETAILED DESCRIPTION OF PREFERRED EMBODIMENTS

An embodiment of the invention is illustrated in FIG. 4.

The drive circuit 4 is constructed as an open drain of an N-channel MOS to satisfy the maximum voltage and drive current requirements, and the logic control circuit 5 is made up of a complementary MOS to reduce the consumption of electric current by the system. The development of the latch-up phenomenon by a high voltage and large current is prevented by using an N-channel MOS 9 for the drive circuit 4 as shown in FIG. 5. This effect can also be obtained even when a P-channel MOS is used for the drive circuit 4 provided it is constructed with an open drain. The same effect can also be obtained when a complementary MOS is used, but this would depend upon the conditions. The silicon substrate for forming a complementary MOS integrated circuit will usually be N-type. When an N-channel MOS is used for the drive circuit 4, however, the silicon substrate must be P-type.

The reason why the metal-oxide semiconductor does not undergo thermal runaway is described below.

The drive circuit 4 is constructed by using an N-channel MOS as shown in FIG. 5. The electric current flowing into an N-channel MOS 9 is given by the following equation:

$$I = \frac{W\mu C}{L}\left\{ (V_G - V_T)V_D - \frac{1}{2} V_D^2 \right\} \quad (1)$$

where:
I: current flowing in the N-channel MOS 9,
W: channel width of MOS 9,
L: channel length of MOS 9,
$\mu$: mobility,
C: gate capacity,
$V_G$: gate voltage of MOS 9,
$V_T$: threshold voltage of MOS 9,
$V_D$: drain-source voltage of MOS 9.

In equation (1), the parameters which change with temperature are the mobility $\mu$ and the threshold voltage $V_T$. The mobility $\mu$ has a negative temperature coefficient and, hence, acts to reduce the current I as the temperature rises. The threshold voltage $V_T$ also has a negative temperature coefficient so that $(V_G - V_T)$ increases as the temperatue rises, and this acts to increase the current I. In equation (1), the temperature coefficients of the mobility $\mu$ and of the difference $(V_G - V_T)$ between the gate voltage and the threshold voltage cancel and, hence, the current is automatically prevented from increasing despite any increase in temperature. Therefore, if thought is given on how to radiate the heat produced by the heating unit, the effect on the reliability by the heat produced by the drive circuit and by the heating unit in the thermal print head can be neglected. Accordingly a radiator plate can be designed easily, the thermal print head can be manufactured at a reduced cost, and the reliability can be enhanced.

The system of the semiconductor device of the present invention and its operation will now be described.

As illustrated in FIG. 4, the semiconductor device of the present invention consists of the logic control circuit 5, the drive circuit 4, and a level shifter 6. FIG. 5 illustrates the drive circuit 4 in detail and the gate of the N-channel MOS 9 is connected to the output of the logic control circuit 5.

The feature of the present invention resides in that the logic control circuit 5 is driven by a low voltage by power source 7 to reduce its electric current consumption, and the drive circuit 4 of the heating unit 3 is driven by a high voltage via the level shifter 6 and power source 8. According to the present invention, the heating unit which has heretofore been driven by a bipolar element is now driven by a MOS. Therefore, a current equivalent to that for the bipolar element must be supplied through the MOS, and thus a voltage as high as 15 to 30 volts must be applied to the drive circuit 4 from the level shifter 6. However, the logic control circuit 5, which consists of a CMOS, would consume a large current if driven by a voltage of 15 to 30 volts, which would offset the effects of the CMOS. The operating voltage of 4 volts to 6 volts is sufficient to accomplish the speeds of less than 10 MHz required by the CMOS. For reasons of current consumption and stability in operation, therefore, a voltage of 4 volts to 6 volts is applied to the logic control circuit 5.

Up until now, a bipolar element has been used in the logic control circuit because of the drive using a large current, which results in thermal runaway and eventually thermal breakdown. According to the present invention, on the other hand, a large current is obtained by a MOS. Namely, the drive circuit is operated at a high voltage to correct the defects of the MOS, and the occurrence of thermal breakdown is prevented by utilizing the saturation of the driving current according to the temperature characteristic of the MOS. Another feature of the invention is that the consumption of electric current is reduced by the use of a CMOS. That is, a high-speed operation comparable to that of a bipolar element is accomplished with a current which is less than one-thirtieth the current needed conventionally. The present invention exhibits the effects of small current consumption, high speed, and increased reliability and therefore has wide applicability, as the dot density increases and the thermal head operates at faster speeds in the future.

Although the above description has dealt with the invention as applied to a thermal head, it should be noted that the invention is in no way limited to a thermal print head, but can also be applied to a plasma display, a fluorescent display tube, and any other semiconductor devices which require a high voltage and large current. Further, although the description has explained the embodiment in which the drive circuit was made up of an N-channel MOS, the same effects can also be obtained when the drive circuit consists of a P-channel MOS or a CMOS.

I claim:

1. A semiconductor device for use with a thermal print head comprising: a logic control circuit comprised of at least one MOS; a level shifter having an input connected to an output of the logic control circuit; a drive circuit consisting of an MOS having a gate connected to an output of the level shifter; and a heating element connected to be driven by the drive circuit to generate heat.

2. A semiconductor device according to claim 1; wherein the drive circuit MOS comprises an N-channel MOS.

3. A semiconductor device according to claim 2; wherein the logic control circuit comprises a CMOS.

4. A semiconductor device according to claim 1; wherein the logic control circuit comprises a CMOS.

* * * * *